United States Patent
Centofante

[19]

[11] Patent Number: 6,115,256
[45] Date of Patent: Sep. 5, 2000

[54] CARD WITH RETRACTABLE RJ JACK

[75] Inventor: Charles Alfred Centofante, Los Altos, Calif.

[73] Assignee: ITT Manufacturing Enterprises, Inc., Wilmington, Del.

[21] Appl. No.: 09/205,954

[22] Filed: Dec. 4, 1998

[51] Int. Cl.[7] .............................. H05K 1/14; H01R 23/02
[52] U.S. Cl. ......................... 361/737; 361/736; 361/753; 439/131; 439/676; 439/946
[58] Field of Search ...................................... 361/684–687, 361/724–727, 728, 736, 737, 796; 439/131, 144, 676, 946; 206/706; 235/492; 220/4.02

[56] References Cited

U.S. PATENT DOCUMENTS

| | | | |
|---|---|---|---|
| 4,915,655 | 4/1990 | Tanaka | 439/676 |
| 5,035,641 | 7/1991 | Van-Santbrink et al. | 439/329 |
| 5,183,404 | 2/1993 | Aldous et al. | 439/55 |
| 5,336,099 | 8/1994 | Aldous et al. | 439/131 |
| 5,338,210 | 8/1994 | Beckham et al. | 439/131 |
| 5,391,083 | 2/1995 | Roebuck et al. | 439/76 |
| 5,391,094 | 2/1995 | Kakinoki et al. | 439/638 |
| 5,395,268 | 3/1995 | Okada | 439/676 |
| 5,411,405 | 5/1995 | McDaniels et al. | 439/131 |
| 5,463,261 | 10/1995 | Skarda et al. | 307/131 |
| 5,477,418 | 12/1995 | MacGregor et al. | 361/737 |
| 5,499,923 | 3/1996 | Archibald et al. | 439/26 |
| 5,505,633 | 4/1996 | Broadbent | 439/329 |
| 5,509,811 | 4/1996 | Homic | 439/55 |
| 5,538,442 | 7/1996 | Okada | 439/676 |
| 5,547,401 | 8/1996 | Aldous et al. | 439/676 |
| 5,562,463 | 10/1996 | Tan | 439/76.1 |
| 5,562,504 | 10/1996 | Moshayedi | 439/638 |
| 5,608,607 | 3/1997 | Dittmer | 361/686 |
| 5,634,802 | 6/1997 | Kerklaan | 439/131 |
| 5,637,018 | 6/1997 | Gargiulo | 439/640 |
| 5,667,395 | 9/1997 | Okada et al. | 439/131 |
| 5,679,013 | 10/1997 | Matsunaga et al. | 439/144 |
| 5,692,914 | 12/1997 | Mitani et al. | 439/131 |
| 6,005,774 | 12/1999 | Chiba et al. | 361/737 |

*Primary Examiner*—Jayprakash N. Gandhi
*Attorney, Agent, or Firm*—Thomas L. Peterson

[57] ABSTRACT

A thin electronic card (10) can securely receive and connect to contacts of an RJ or telephone type plug (40). The card has a vertical hole (52) through which the RJ plug can be inserted. The front wall (84) of the hole has downwardly-facing card shoulders (80,82) for abutting the upwardly-facing shoulders (70,72) of the RJ plug latch (62), and the front wall has a rib (96) with an upwardly-facing shoulder (100) that lies below and laterally between the other card shoulders to engage a largely downwardly-facing shoulder (92) on the latch. The hole is formed in an adaptor (50) that can slide forward (F) and rearward (R). The adaptor includes a frame (110) that forms the front wall of the hole and the shoulders thereat, and a separate contact block (112). The contact block slides a shorter distance than the frame when both of them are slid to the fully stowed position within the card frame (32). Contacts (116) on the contact block have resilient front ends that are slideably engaged with traces on the circuit board.

19 Claims, 5 Drawing Sheets

CARD WITH RETRACTABLE RJ JACK

BACKGROUND OF THE INVENTION

Electronic cards such as PC cards constructed in accordance with PCMCIA (Personal Computer Memory Card International Association) and CFA (Compact Flash Association) standards and related standards, have a small thickness, with types I, II, III having maximum thicknesses of 3.3 mm, 5 mm, and 10.5 mm, respectively. The most popular type is Type II which has a thickness of 5 mm. These cards are commonly inserted into slots of electronic devices such as personal computers to transfer data stored in the card or from an external source such as a modem, telephone, etc., connected to the rear of the card. A very common type of connector is an RJ plug, commonly used as a telephone plug for connection to telephones. Three standard types of such plugs are RJ 11, RJ 14, and RJ 45, which have different numbers of terminals. The RJ 45 plug, which has 6 to 8 terminals, is wider than the others and is commonly used for data transmission. All of the RJ plugs have a height of more than the 5 mm height of Type II cards, so it is not straightforward to connect an RJ plug to a thin electronic card, especially a Type I or II card. U.S. Pat. No. 5,338,210 shows an approach where the RJ plug is laid down against a face of an adaptor that pulls out of the card, with a bale or other hold-down required to hold the plug in place.

Another approach described in U.S. Pat. No. 5,338,210 is to form a largely vertical hole in the adaptor and to slide the RJ plug largely vertically into the hole. The plug is slid down until the bottom of the plug is stopped by a lip at the bottom of the hole rear, while upwardly-facing shoulders of a plug latch lie under shoulders at the top of the hole front. The hole is angled in order to form a hole with an effective height between its front and rear of more than 5 mm. A card with a vertical hole for receiving an RJ jack which avoided the need for an angled hole, would be of value. It would also be of value if a pull-out adaptor took up a minimum of space within the card and was easily pulled out for deployment.

SUMMARY OF THE INVENTION

In accordance with one embodiment of the present invention, an electronic card is provided for receiving a standard shape RJ plug in a simple construction that minimizes the space required for enabling such connection to the RJ plug. The card forms a vertical hole with front and rear walls for receiving the plug as the plug is inserted downwardly through the hole. The front wall has a pair of downwardly-facing card shoulders for engaging upwardly-facing latch shoulders on a deflectable plug latch, to prevent upward pull-out of the plug after it has been inserted. The adaptor front wall also forms a rib with an upwardly-facing rib shoulder for engaging a largely downwardly-facing middle shoulder on the latch, to prevent excessive downward movement of the plug through the hole.

The adaptor can slide forwardly out of the forward end of the electronic card housing. The adaptor includes a frame that forms the front wall of the hole and that slides a long distance. A contact block forms the rear wall of the hole and includes contacts for engaging terminals on the plug. The contact block slides a much smaller distance into and out of the card housing then the frame, so a minimum of space within the card is occupied by the adaptor. The rear ends of the contacts are connected to circuit board traces by lying in sliding contact with the traces. The electrically conductive traces are positioned so the contacts land on the traces only as they approach the full forward position of the adaptor. A retraction device in the form of a strap enables pull-out of the adaptor.

The novel features of the invention are set forth with particularity in the appended claims. The invention will be best understood from the following description when read in conjunction with the accompanying drawings.

DESCRIPTION OF THE PREFERRED EMBODIMENTS

Figures 1, 2:
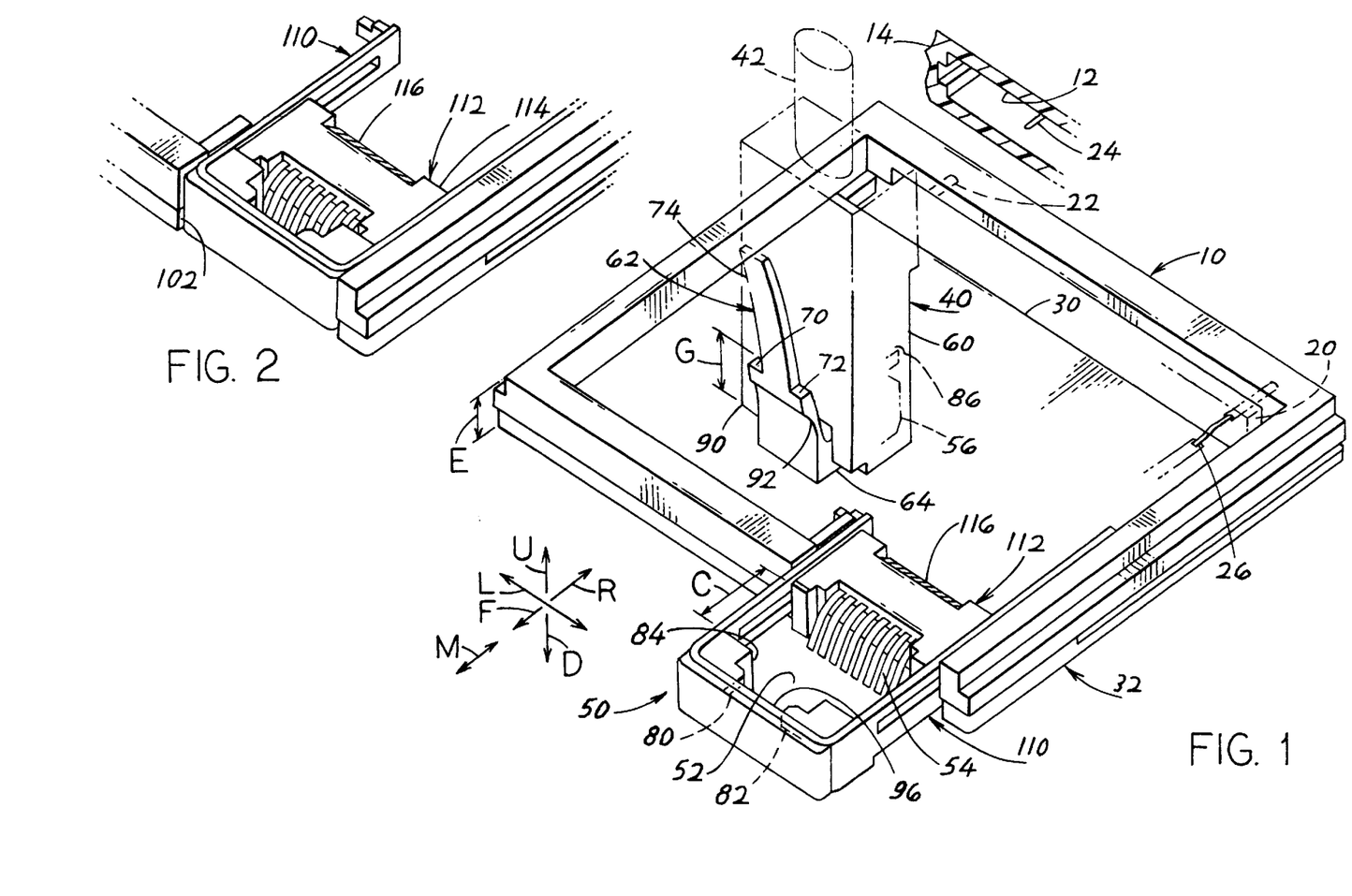
FIG. 1 is a partial isometric view of an electronic card with the plug-receiving adaptor in its deployed position, and also showing an RJ plug with its bottom in solid lines and its top in phantom lines, and with the plug not yet inserted into the adaptor.
FIG. 2 is a partial isometric view of the electronic card of FIG. 1, with the adaptor in its fully stowed position.

FIG. 1 illustrates an electronic card 10 of a type that is slid into a thin slot 12 of an electronic device 14 such as a laptop computer. Standards of PCMCIA specify a maximum card height E of 5 mm for the most popular type which is a type II card. The cards have a width in a lateral direction L of 54 mm and have a length in a longitudinal direction M which is 85.6 mm for a full size card and about 36.5 mm for a small card that is sometimes referred to as a compact flash card. The rear of the card has a rear electrical connector 20 with sockets 22 that mate to pins 24 at the rear end of the slot 12 in the electronic device. The sockets 22 on the connector have front ends 26 that are engaged with traces on a circuit board 30 of the electronic card. The card has a housing 32 with top and bottom covers (not shown in FIG. 1) that protect the circuit board and components thereon.

The electronic card 10 of FIG. 1 is constructed to enable its connection to an RJ plug 40 which is commonly referred to as a telephone-type plug. Wires 42 extending from the plug can connect to a telephone, a modem, an antenna, or other devices. The electronic card is provided with an adaptor portion or adaptor 50 for connection to the RJ plug 40, by moving the plug substantially downwardly D (preferably within 15° of the vertical when the card is horizontal) into and through a primarily vertically-extending hole 52 in the adaptor. When the plug is fully inserted, plug-engaging contact parts 54 of the adaptor contacts 116 engage plug terminals 56 on the plug.

There are three major types of RJ plugs, including the smallest which have a height in directions U, D of about 12.3 mm and are used in voice transmission from telephones, and the largest, RJ 45, which is used in data transmission and that has six or eight terminals and a height of about 21.4 mm. Each plug includes a plug block portion 60 and a latch 62 which is joined to the bottom of the block portion at joint 64. The latch has opposite sides with upwardly-facing latch side shoulders 70, 72, and has a handle 74 that can be deflected rearwardly against the block portion 60. The plug 40 is moved down into the adaptor hole 52 until the latch side shoulders 70, 72 snap forward and lie immediately under frame or card shoulders 80, 82 on an adaptor front wall 84. This prevents upward movement of the plug out of the hole. However, a means must be provided to limit the downward movement of the plug 40 through the hole, or else the plug-engaging contact parts 54 will ride into a rear cavity 86 and prevent upward pullout of the plug without damaging the contacts. It is difficult to use the front bottom corner 90 of the plug to limit downward movement because the vertical distance G between the corner 90 and the shoulders 70, 72 is 5.9 mm which is considerably more than the maximum height of about 4.5 mm of the adaptor.

Applicant notes that the plug latch 62 has a partially downwardly-facing middle shoulder 92 resulting from providing a thin part of the latch for easy bending, with much or most of the bending of the latch occurring at about the shoulder 92. Applicant provides the front wall 84 of the adaptor with a rib 96 to engage the middle shoulder 92 of the latch so as to limit the downward movement of the latch into the hole.

Figure 3:
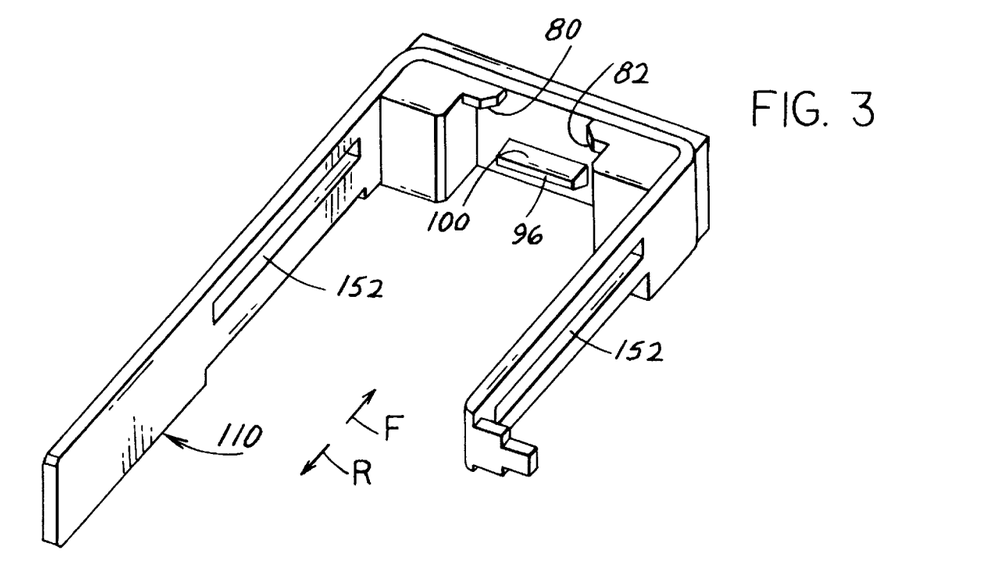
FIG. 3 is a rear isometric view of the frame of the adaptor of the card of FIG. 1.
Figures 6, 9, 10:
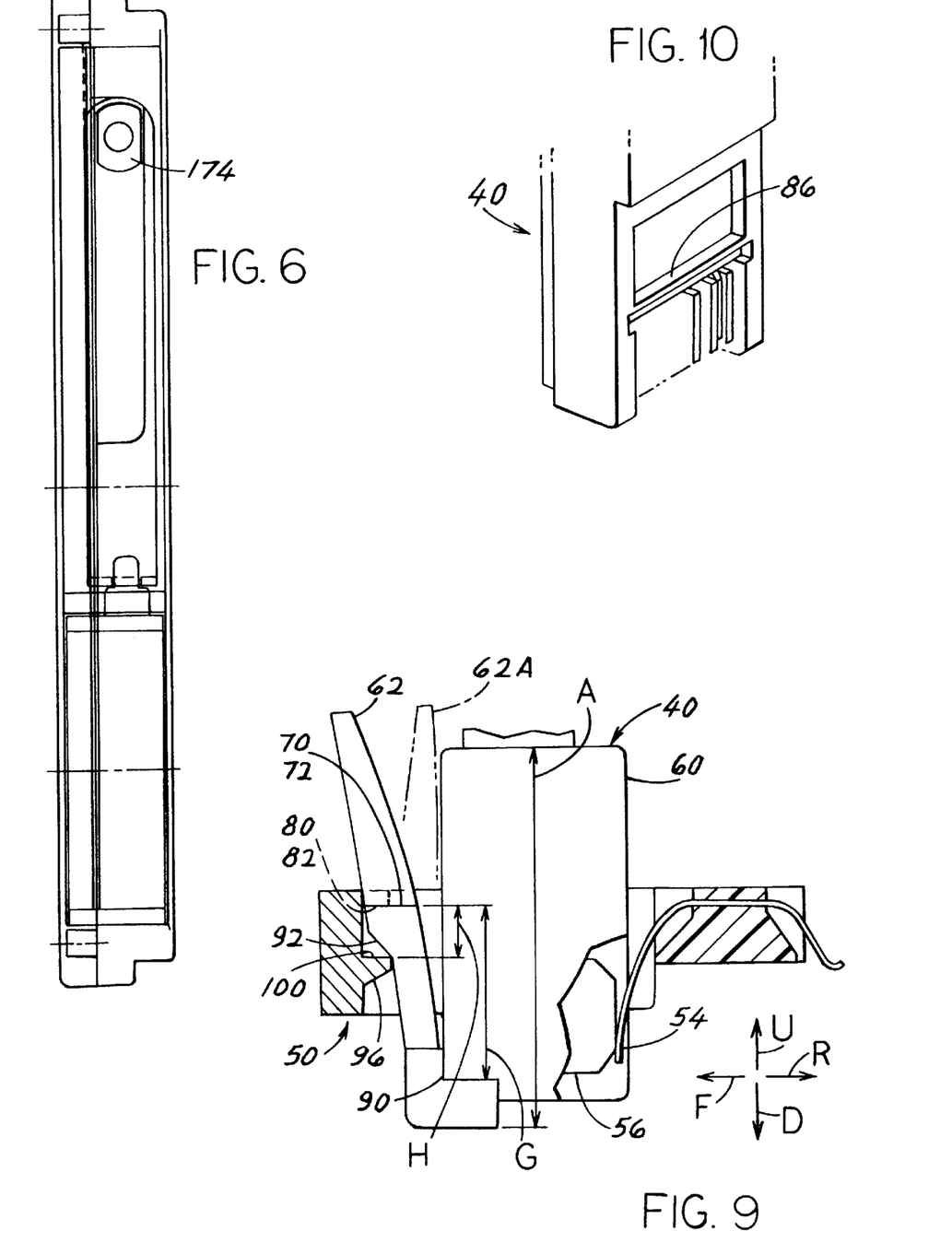
FIG. 6 is a rear elevation view of the card of FIG. 5.
FIG. 9 is a view of a portion of FIG. 7, with the plug in its fully inserted position in the adaptor.
FIG. 10 is a partial rear isometric view of the plug of FIG. 9.

FIG. 3 shows the rib 96 which has a largely upwardly-facing rib shoulder 100 that lies below and between the largely downwardly-facing card shoulders 80, 82. At least part of the rib and shoulder 100 lies between the card shoulders 80, 82. FIG. 9 shows the plug 40 fully installed in the adaptor 50. It can be seen that when the latch side shoulders 70, 72 engage the card shoulders 80, 82, to prevent upward movement of the plug, the latch middle shoulder 92 engages the rib shoulder 100 to prevent downward movement of the plug. The rib preferably engages the bottom of the latch middle shoulder 92, but can engage any other part. The distance H between the latch shoulders 70, 72 and the bottom of the latch middle shoulder 92 is about 2 mm, which is much less than the height of about 4.5 mm of the adaptor rear wall. It is also noted that the latch 62 can be deflected rearwardly to the position 62A to move the latch shoulders 70, 72 out of line with the card shoulders 80, 82 to remove the latch by pulling it up. If the vertical distance between the card shoulders 80, 82 and the rib shoulder 100 is less than the vertical distance H between the latch shoulders, the latch can accommodate this by bending slightly toward the position 62A. Thus, even though the height A of the plug 40 is much greater than the maximum height of the adaptor hole, and is even greater than the height G between the latch shoulders 70, 72 and the front lower corner 90 of the front block portion, applicant is able to fix the vertical height of the block in both up and down directions within the thin adaptor. It is noted that while the adaptor preferably slides forwardly out of the forward end of the card, it is also possible to provide a hole within the card housing 32, as with rear portions of the card covers (132, 134 in FIG. 8) being slideable to uncover the hole.

Figure 4:
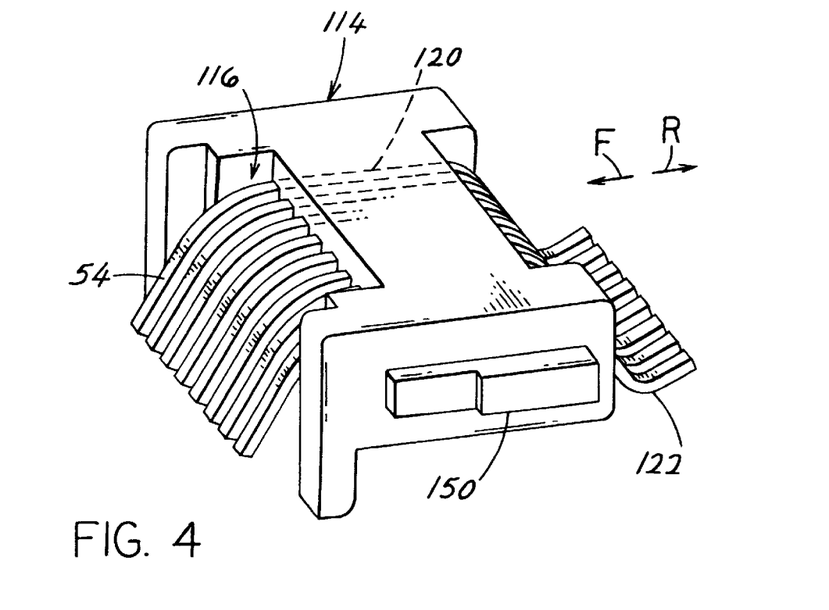
FIG. 4 is a front isometric view of the contact block of the adaptor of the card of FIG. 1.

FIGS. 1 and 2 show that the adaptor 50 can slide between the deployed position of FIG. 1 and the stowed position of FIG. 2. The adapter includes a frame 110 and a separate contact block 112. The frame 110 is preferably formed at least partially of metal such as steel for high strength, while the contact block 112 includes a body 114 of dielectric material and contacts 116 as shown in FIG. 4. The contacts 116 preferably have mounted parts 120 that are molded into the body 114 of the dielectric plastic contact block. The contacts have free front ends 54 that form the plug-engaging parts, and have free rear contact ends 122.

Figure 7:
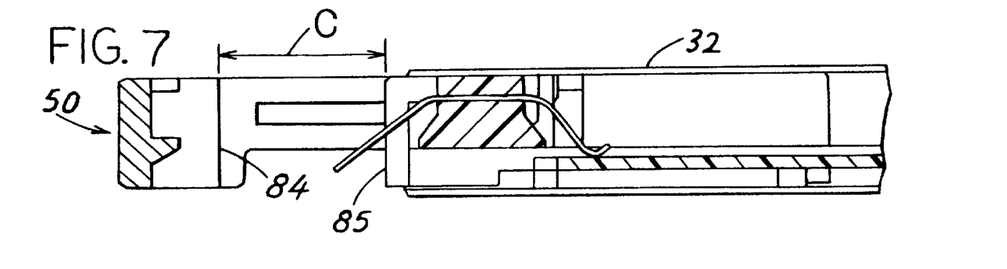
FIG. 7 is a view taken on line 7—7 of FIG. 5, and showing the card covers.
Figure 8:
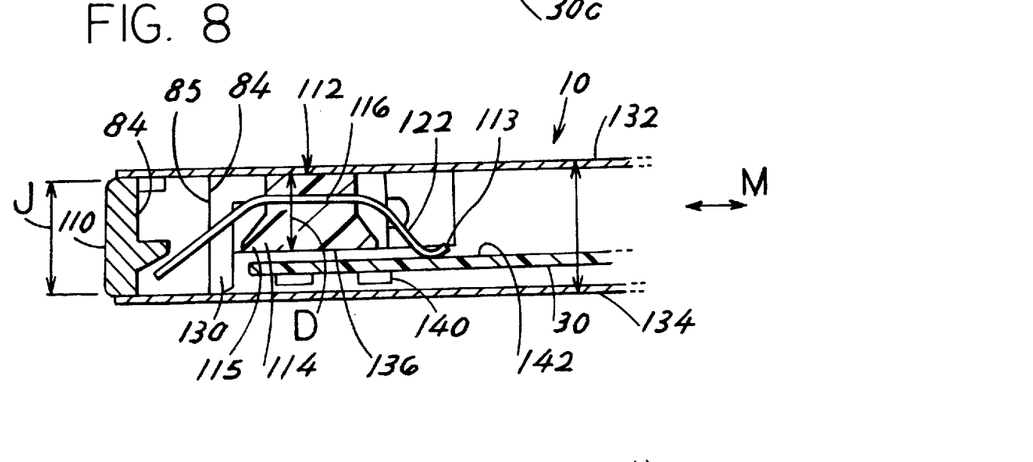
FIG. 8 is a view similar to that of FIG. 7, but with the adaptor in its stowed position.

It would be possible to fix the contact block 1 14 to the frame 1 10 so they slid forward and rearward together. However, applicant prefers to have the contact block 114 and frame 110 slide independently forward and rearward in order to minimize the space occupied by the adaptor within the card, in the stowed position of the adaptor. FIG. 7 shows the adaptor 50 in its deployed position, with front and rear walls 84, 85 separated by a distance C of 6.5 mm, which is the distance between the front and rear of the front block portion at its sides. The adaptor projects at least 5 mm (and actually 11 mm) forward of the card housing in the deployed position, but no more than about 2 mm in the stowed position. FIG. 8 shows that in the stowed position, the distance between the front and rear walls at 84, 85 is zero. As a result, the contact block and contacts 116 move rearward by a smaller distance than the adaptor frame 110, and less volume is occupied by the stowed adapter. That is, electronic components can be mounted on the upper face of the circuit board 30 at locations rearward of the extreme rear tips 113 of the contact. By moving the contact block and the contact rear tips II 3 less when moving the adaptor to the stowed position, more space is available on the circuit board 30 for holding components.

It can be seen in FIG. 8, that the frame front wall 84, and front end 130 of the contact block body 114, each extends by a height J of at least about 80% of the card height E and occupies substantially the entire height between the top and bottom covers 132, 134 of the card. However, the contact block body has a portion 115 that extends along most of the longitudinal M length of the contact block body 114 and has a height D that is no more than about 60% of the card height. The heights J and D are 4.4 mm and 2.6 mm (88% and 52% of card height). The height D of about 2.6 mm leaves a space of a height of about 1.8 mm under the body rear portion 136 and above the lower cover 134 of the card housing. The circuit board 30 extends into this space, and thin components or wiring indicated at 140 can lie on the lower face of the circuit board there. It is noted that the circuit board can lie at the top of the card, with the contact rear portions 122 then extending upwardly instead of downwardly to circuit board traces.

The connection of the contacts 116 to traces 142 on the circuit board, can be accomplished in different ways. One way is to provide a flexible cable between the contacts 116 and the circuit board traces. However, such a flexible cable tends to harden and break after it is bent perhaps a few thousand times. Applicant prefers to form the contacts 116 so their rear ends 122 are in the form of resilient beams that press down against the traces 142 on the circuit board. As the contact block 112 moves forward and rearward for deployment and stowage, the beam formed by the rear-end 112 of the contact slide along the traces 142.

Figure 11:
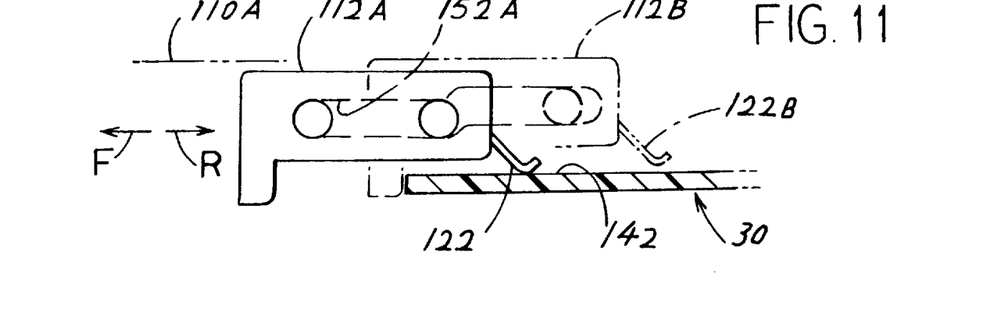
FIG. 11 is a sectional side view of a contact block and circuit board of an electronic card constructed in accordance with another embodiment of the invention, which reduces wear on the contact rear ends.
Figure 12:
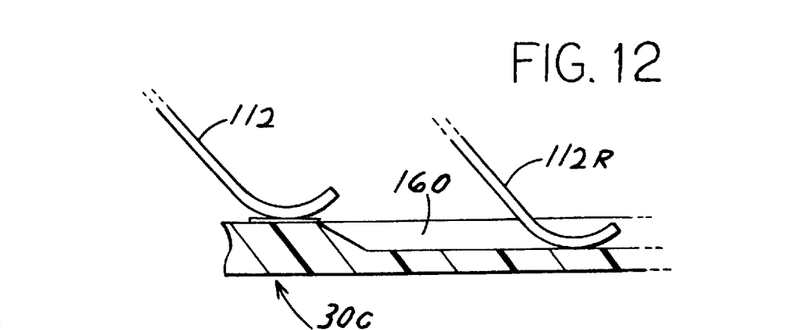
FIG. 12 is a side view of a contact block and circuit board constructed in accordance with another embodiment of the invention, which also minimizes wear on the contact rear ends.

FIGS. 3 and 4 show that the contact block is formed with guides 150 that are engaged in tracks 152 in the frame 110, to enable the contact block to slide relative to the frame and retain its orientation. FIG. 11 shows another construction where the tracks 152A on the frame 110A are oriented to tilt and raise the block from its initial position 112A to a raised position indicated at 112B. In the raised position, the contact rear ends 122B are raised, so they either do not press against the tracks 142 on the circuit board, or press with less force against the tracks, as the contact block moves rearward from its fully deployed position. This increases the life of the contact rear portions 122. FIG. 12 illustrates another construction, where the contact block does not tilt or move up, but where a recess 160 is provided in the circuit board 30C to reduce pressure on the contact rear portions at 112 and 112R to increase their lifetime despite sliding movement.

Figure 13:
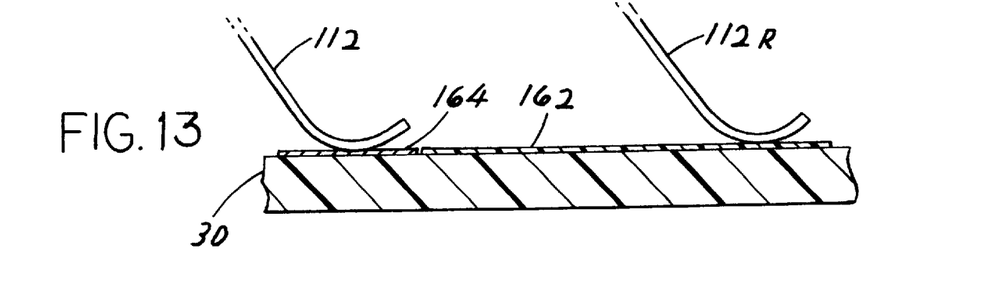

FIG. 13 shows a construction similar to that of FIGS. 1–10 but with a sheet of TEFLON or other low friction material extending rearward of the electrically conductive traces that the contact rear ends slide against. FIG. 13 shows a film 162 of low friction material lying on the upper face of the circuit board 30 rearward of a short electrically conductive trace portion 164 on the board. The trace portion 164 may be of a gold-plated copper alloy and connected to other circuitry on the card, while the film 162 may be of TEFLON or a polyethlyne having about the same thickness as the trace. The contact rear portions may be a gold-plated copper alloy, and the sliding friction (coefficient of friction) of the contact against the film 162 is much lower than the contact sliding friction against the trace portion 164. The trace portion 164 may end at the front end of the film 162, or the film can cover a rear portion of the trace.

Figure 5:
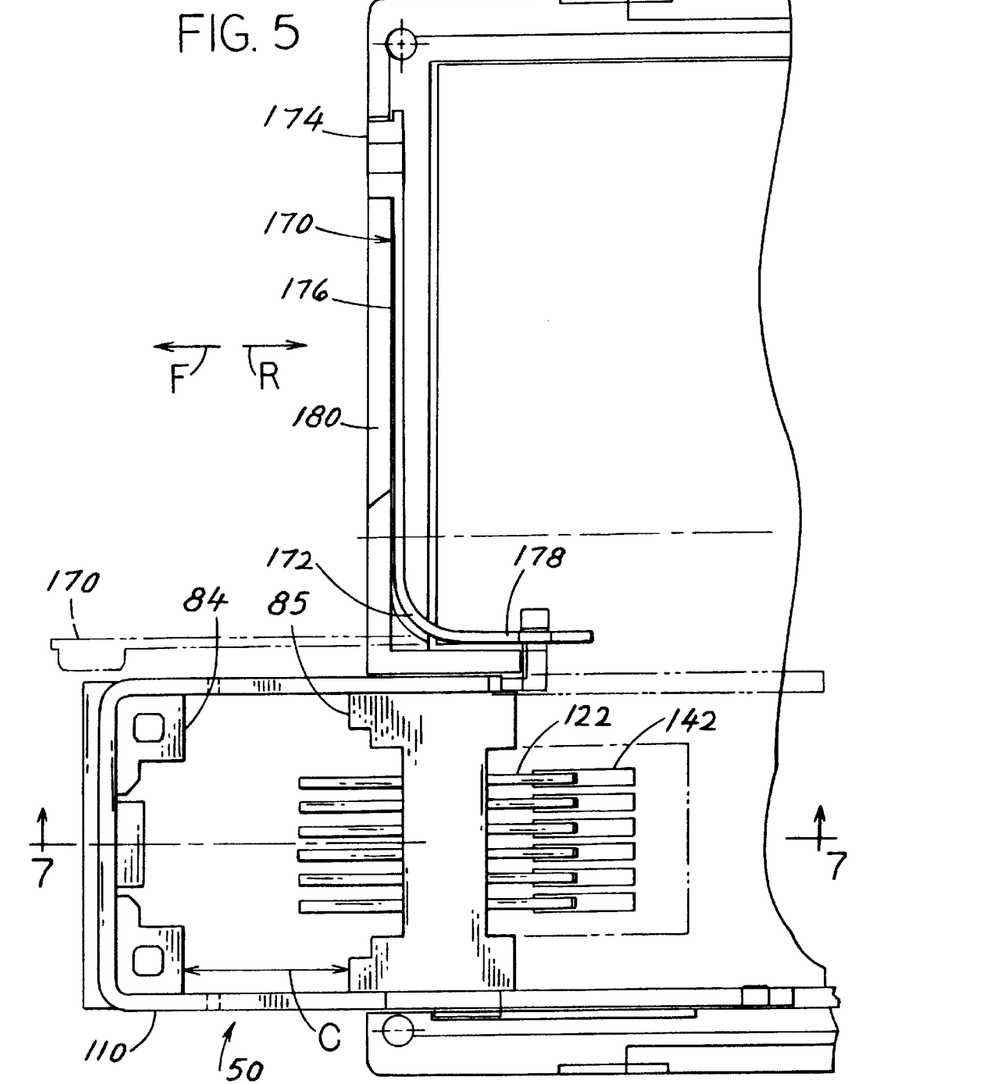
FIG. 5 is a partial plan view of the card of FIG. 1, with the adaptor in its deployed position and the top cover removed.

To pull out the adaptor 50 to its deployed position of FIG. 5, it is possible to provide a recess in the top cover of the card, into which a person's finger nail can be inserted. However, this results in an opening into which dirt can fall. It is also possible to provide a click mechanism in which pushing in the adaptor a second time causes it to spring out by a few millimeters so it can be grasped and pulled out further. However, such a click mechanism adds to the complexity and reduces reliability. Applicant provides a bendable pull out strap device 170 which includes an elongated bendable part 172 such as a flexible strap or wire, and a handle at 174 which is connected by a front portion 176 to the bendable part 172. Preferably, the entire strap device 170 is molded of plastic, and its rear end at 178 is fixed to the frame 110 of the adaptor to pull it out. The front end 174 which forms a handle, is preferably retained in a slot 180 at the front end of the card and is retained therein with a slight interference fit.

While terms such as "top", "bottom", etc. have been used to described the relative positions of the card and plug as illustrated, the card and its parts can be used in any orientation with respect to the Earth.

Thus, the invention provides an electronic card which can receive a RJ plug by moving the plug primarily downwardly into a hole in the card, and preferably a hole in an adaptor that can slide forwardly out of the front end of the card. The hole has front and rear walls with contacts at the rear walls for engaging contacts of the plug. The front wall of the hole has a pair of side shoulders that face largely downwardly to engage upwardly-facing latch shoulders on the resiliently deflectable plug latch. The front wall of the hole also has a rib-forming a largely upwardly-facing rib shoulder that lies between and below the frame shoulders, to engage a largely downwardly-facing middle shoulder on the latch. Where the hole lies in a slideable adaptor, the adaptor preferably includes a frame that forms the front wall of the hole and a contact block that forms the rear of the hole, with the frame and contact block being slideable independently of each other. This allows the contact block to slide less when moving to its stowed position, by closing the hole, so the adaptor occupies less room within the card housing. The rear portion of the contact block has a smaller height to accommodate a circuit board under (or over) it. The contact block has contacts with rear ends that are slidably engaged with traces on a circuit board in the card. The card is constructed with means for landing the contact rear ends against electrically conductive circuit board traces as the contact block reaches its forward deployed position, to minimize wear on the contact rear ends. A pull out device can be formed at the front of the card in the form of a strap to help pull out the adaptor.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. An electronic card with a rear portion for connection to a RJ plug, wherein the card has a small card thickness for fitting into a thin slot of an electronic device, where the length of the RJ plug to be connected is greater than the thickness of said card, and where the RJ plug includes a plug block portion, a plurality of plug terminals with engaging ends lying at a rear of the plug block portion, and a latch merging at a joint lying at a bottom of the plug block portion and extending generally upwardly therefrom in front of said plug block portion, where said latch has laterally opposite sides and a pair of upwardly facing latch side shoulders at said opposite sides and a largely downwardly-facing middle shoulders at the front of the latch at a short distance below said latch side shoulders which is less than said card thickness, wherein:

said card includes an adaptor portion that forms a primarily vertically-extending hole for receiving the RJ plug, said adaptor portion having a hole front wall and a plurality of contacts having plug-engaging contact parts at the rear of said hole;

said adaptor portion front wall forming a pair of laterally-spaced largely downwardly-facing card shoulders for engaging said largely upwardly-facing latch shoulder on the plug latch;

said adaptor portion front wall forms a rib lying below said card shoulders and forming a largely upwardly-facing rib shoulder for engaging said largely downwardly-facing middle shoulder on said latch.

2. The card described in claim 1 wherein:

said latch is resiliently deflectable toward said plug block portion at locations above said joint;

said adaptor portion has rear hole walls that limit rearward movement of said plug in said hole, and said rib projects rearward far enough that walls of said latch that form said largely downwardly-facing middle shoulder cannot pass down behind said rib even when said latch is fully deflected toward said plug block portion.

3. The card described in claim 1 wherein:

said card has a card housing and an electrical connector that is fixed to said card housing;

said adapter portion comprises an adaptor that is slidable in forward and rearward directions in said card housing and projects forward of said card housing when slid to a full forward position;

said adaptor includes a frame that forms said hole front wall, and a contact block that includes a body of insulative material and a plurality of contacts having mounted parts fixed to said body;

said frame and said contact block are separately slidable in said card housing, with said frame being slidable by a greater distance than said contact block is slidable so the front-to rear dimension of said hole is reduced when both said frame and said contact block are fully slid rearwardly into said card housing, to thereby save space in said card housing.

4. The card described in claim 1 wherein:

said card has a card housing, and has a circuit board lying in said housing and fixed in place therein;

said adapter portion comprises an adaptor that is slidable in first and second longitudinal directions in said card and said hole lies outside said housing when said adaptor is fully slid in said second direction;

said adaptor includes a frame that forms said hole front wall, and a contact block with a body and with said contacts fixed to said body;

said frame front wall extends at least about 80% of the height of said housing, while said body of said contact block has a rear portion that extends longitudinally by at least half the longitudinal length of said body and said body extends in a height direction by no more than 60% of the height of said housing, and said circuit board lies vertically beyond said body rear portion, whereby to enable said board to extend over more area of the card.

5. The card described in claim 1 wherein:

said adaptor portion includes a contact block having a body of insulative material with said contacts having middle portions fixed to said block, said block being slidable in rear and front directions between deployed and stowed positions;

said card includes a circuit board with a plurality of traces, and said contacts have rear ends in the form of resilient beams with free ends that are biased toward said traces to press firmly against said traces in said deployed position of said contact block.

6. The card described in claim 5 wherein:

said card has a card housing;

means coupled to said card housing for positioning said contact rear ends away from said traces as said contact block moves toward said deployed portion and for positioning said contact rear ends firmly against said traces as said contact block closely approaches said deployed position.

7. The card described in claim 5 wherein:

each of said traces has a short exposed trace portion, and including a film of material having a lower sliding friction than said trace portion against said beam free ends, with said film extending rearward of said exposed trace portion.

8. The card described in claim 1 wherein:

said card has a card housing;

said adapter portion comprises an adaptor that is slidable in forward and rearward longitudinal directions in said card housing between deployed and stowed positions, and said adaptor projects from said card housing when slid fully forward to said deployed position; and including a bendable pullout strap device which has a rear end connected to said adapter, a front portion extending in a lateral direction that is perpendicular to said longitudinal directions along the front end of said card housing in the stowed position of said adaptor, and a middle part that is bendable.

9. A combination of an electronic card (10) and an RJ plug (40), where the card has a height (E) of no more than 5 mm and where said plug has a plug block portion with a height (A) of more than 5 mm and with front and rear ends and with a plurality of plug terminals (56) at said rear end of said plug block portion, and said RJ plug has a latch (62) with a lower end merging (64) with a bottom of said plug block portion and extending generally upward therefrom and being resiliently deflectable rearwardly against said plug block portion from an initial undeflected state, where said latch has a pair of laterally opposite primarily upwardly-facing latch side shoulders (70, 72) and has a largely downwardly-facing middle latch shoulder (92) at the front of the latch and at a distance (H) of less than 5 mm below said latch side shoulders, wherein:

said card has a largely vertical hole (52) with a card hole front wall and said plug extends primarily vertically through said hole with said latch lying in substantially said initial state;

said card hole front wall having opposite sides with largely downwardly facing card shoulders (80,82) thereat that substantially abut said primarily upwardly-facing latch side shoulders, and said card hole front wall having a rib (96) with a largely upwardly facing rib shoulder (100) that lies below and has a portion that lies laterally between said card shoulders with said rib shoulder lying closely under said middle latch shoulder (92) to prevent upward movement of said plug, and with said card having a plurality of contacts (116) that engage said plug terminals.

10. The combination described in claim 9 wherein:

said card includes a card housing (32) and includes an adapter (50) that forms said largely vertical hole, with said card housing having a front end with a passage (102) therein and with said adaptor being slideable rearwardly and forwardly into and out of said passage between stowed and deployed positions when said plug is not in said hole, with said adaptor lying substantially completely within said housing in said stowed position;

said adaptor including a frame (110) that forms said card hole front wall (84), and said adaptor including a contact block (112) with a dielectric body (114) that forms at least part of a rear wall of said hole;

said frame and said contact block being slideable independently of each other with said frame being slideable further than said contact block between said stowed and deployed positions of said adaptor.

11. The combination described in claim 9 wherein:

said card includes a card housing and includes an adapter that forms said largely vertical hole, with said housing having a rear end with a passage therein and with said adaptor being slideable rearwardly and forwardly into and out of said passage between stowed and deployed positions when said plug is not in said hole, with said adaptor lying substantially completely within said housing in said stowed position;

said adaptor including a frame that forms said card hole front wall, and said adaptor including a contact block with a dielectric body and said plurality of contacts;

said card includes a circuit board fixed in said card housing and having a plurality of traces (142), with said contacts having rear ends (122) resiliently biased into engagement with said traces at least when said adapter lies in said stowed position, and with said contact rear ends slideable forward and rearward with respect to said traces.

12. An electronic card that includes a card housing with front and rear ends, a circuit board that has traces and that lies in and is fixed to said card housing, and an adaptor with a largely vertical plug-receiving hole for receiving a plug and for connecting terminals of the plug to said traces of said circuit board, wherein:

said adaptor includes a frame and a contact block that are each slideable in rearward and forward longitudinal directions between a stowed position wherein substantially all of said frame and said contact block lie in said card housing and a deployed position wherein a rear end of said frame projects a plurality of millimeters rearwardly of said card housing;

said contact block comprises a dielectric body and a plurality of contacts fixed to said body and connected to said board traces and having free front ends;

said frame and said contact block respectively form rear and front walls of said plug-receiving hole with said contact free front ends lying at the rear of said hole;

said frame and said contact block are separately slideable with said frame being slideable by a greater distance between said deployed and stowed positions of said adaptor than the distance of sliding of said contact block between said deployed and stowed positions, so the longitudinal length of said hole is smaller in said stowed position than said deployed position, to thereby minimize the space occupied by the stowed adapter.

13. The card described in claim 12 wherein said plug-receiving hole is designed to receive an RJ type plug that includes a plug block portion, a plurality of plug terminals with engagable ends lying at a rear of said plug block portion, and a latch merging at a joint lying at a bottom of a rear of the plug block portion and extending generally upward therefrom and lying forward of said plug block portion, where said latch has opposite sides and a pair of upwardly facing latch side shoulders at said opposite sides and a largely downwardly-facing middle shoulder at the front of said latch at a location below said latch side shoulders, wherein:

said front wall of said hole formed by said frame, includes a pair of laterally-spaced largely downwardly-facing frame shoulders for engaging said largely upwardly-facing latch shoulders;

said front wall of said hole also including a rib lying below said frame shoulders and forming a largely upwardly-facing rib shoulder for engaging said latch middle shoulder.

14. The card described in claim 12 wherein:

said contacts have largely rearwardly-projecting free ends that are slideable with respect to said traces on said circuit board and that bear against said traces at least in said deployed position of said adapter.

15. The card described in claim 14 wherein:

said boards have at least one film of a low sliding friction material having a lower sliding friction than said traces, lying under most of the path of said contact free ends, with said traces exposed only at a front end of said path.

16. An electronic card for insertion into an electronic device, where said card includes a card housing having front and rear ends, and said card includes a circuit board that has traces and that lies in and is fixed to said card housing, and said card includes an adaptor for connecting to a plug and for connecting terminals of the plug to said traces on said circuit board wherein:

said adaptor has a front portion and said adaptor is slidable between rear and front positions wherein said adaptor front portion respectively lies substantially completely within said card housing, and projects by at least 5 mm rearward of a rear end of said card housing;

said adaptor has a plurality of adaptor contacts with front ends projecting forward of said card housing front end in said forward position of said adaptor and lying rearward of said card front end in said rear position of said adaptor, with said adaptor contacts having resiliently deflectable rear ends that are slideably engaged with said circuit board traces.

17. The card described in claim 16 wherein:

said adaptor includes a contact block comprising a dielectric body and said adaptor contacts with said adaptor contacts have portions fixed to said body;

said card includes means for raising at least a rear end of said dielectric body when said adaptor slides from said front position toward said rear position, to minimized wear on said rear adaptor contact rear ends.

18. The card described in claim 16 including:

means positioning said contact rear ends away from said circuit board traces and against said circuit board traces as said adaptor moves respectively between said rear and front positions.

19. An electronic card for insertion into a slot in an electronic device, where said card includes a card housing and said card has front and rear ends and an adaptor that can slide rearward and forward between a rearward position wherein said adaptor lies substantially completely within said card housing and a forward position wherein said adaptor projects at least 5 mm forward of said card housing, including;

an elongated pull strap device having a front end that is attached to said adaptor and having a rear end that forms a handle for manually pulling out said adaptor from said card housing, and having an elongated part connected said front and rear ends with said elongated part being flexible at least at part of its front end;

said card housing front end forms a handle retainer into which said handle can be placed and retained until manually pulled out.

* * * * *